US011609265B1

(12) United States Patent
Rossmeier et al.

(10) Patent No.: US 11,609,265 B1
(45) Date of Patent: Mar. 21, 2023

(54) END-OF-LIFE PREDICTION FOR CIRCUITS USING ACCELERATED RELIABILITY MODELS AND SENSOR DATA

(71) Applicant: Infineon Technologies AG, Neubiberg (DE)

(72) Inventors: Ludwig Rossmeier, Dorfen (DE); Georg Georgakos, Erding (DE); Bernhard Gstoettenbauer, Engerwitzdorf (AT); Dirk Hammerschmidt, Villach (AT); Veit Kleeberger, Munich (DE); Rafael Zalman, Markt Schwaben (DE); Thomas Zettler, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/457,198

(22) Filed: Dec. 1, 2021

(51) Int. Cl.
*G01R 31/28* (2006.01)
(52) U.S. Cl.
CPC ..... *G01R 31/2856* (2013.01); *G01R 31/2874* (2013.01); *G01R 31/2879* (2013.01)
(58) Field of Classification Search
CPC .............. G01R 31/002; G01R 31/2856; G01R 31/2874
See application file for complete search history.

(56) References Cited

U.S. PATENT DOCUMENTS

| 9,465,373 | B2 | 10/2016 | Allen-Ware et al. | |
|---|---|---|---|---|
| 10,250,029 | B2 | 4/2019 | Carletti et al. | |
| 10,699,041 | B2 | 6/2020 | Hammerschmidt | |
| 2010/0250149 | A1* | 9/2010 | Omori | G01R 31/2849 702/41 |
| 2014/0068298 | A1 | 3/2014 | Simeral | |
| 2014/0312873 | A1 | 10/2014 | Raja et al. | |
| 2017/0299650 | A1* | 10/2017 | Coyne | G01R 31/2879 |

OTHER PUBLICATIONS

"Einfluss von Alterungseffekten auf die Robustheit digitaler Schaltungen", Retrieved from https://www.edacentrum.de/robust/de/content/zue/04_zue12-robust-tutorial-TUM.pdf, Retrieved on Sep. 15, 2021, 40 pp.

(Continued)

*Primary Examiner* — Tung X Nguyen
(74) *Attorney, Agent, or Firm* — Shumaker & Sieffert, P.A.

(57) ABSTRACT

In some examples, a circuit may be configured to perform a method that includes performing a circuit function via a circuit function unit of a circuit, receiving sensor data from one or more sensors associated with the circuit function unit, and estimating a remaining life of the circuit based on an accelerated reliability model and the sensor data, wherein the sensor data comprises input to the accelerated reliability model. The circuit itself may include a dedicated circuit unit that estimates the remaining life of the circuit based on an accelerated reliability model and the sensor data, and the circuit may output one or more predictive alerts or predictive faults when the remaining life is below a threshold, which may prompt the system for predictive maintenance on the circuit.

23 Claims, 6 Drawing Sheets

(56) References Cited

OTHER PUBLICATIONS

Automotive Electronics Council, "Failure Mechanism Based Stress Test Qualification for Integrated Circuits", Automotive Electronics Council, Sep. 11, 2014, 48 pp.
IEC, "Reliability data handbook—Universal model for reliability prediction of electronics components, PCBs and equipment", International Electrotechnical Commission, First edition, 96 pp.
Jenkins et al., "On-chip circuit to monitor long-term NBTI and PBTI degradation," Microelectronics Reliability, Elsevier, accepted Jul. 10, 2013, 5 pp.
Ritter et al., "Aging sensors for on-chip metallization of integrated LDMOS transistors under cyclic thermo-mechanical stress," Microelectronics Reliability, Elsevier, accepted Jun. 6, 2017, 5 pp.
Ritter et al., "Resistance change in on-chip aluminum interconnects under cyclic thermo-mechanical stress," Microelectronics Reliability, Elsevier, Jun. 7, 2019, 5 pp.
U.S. Appl. No. 16/915,794, filed Jun. 29, 2021, naming inventors De Gasperi et al.
U.S. Appl. No. 17/457,166, filed Dec. 1, 2021, naming inventors Gstoettenbauer et al.
U.S. Appl. No. 17/457,183, filed Dec. 1, 2021, naming inventors Zettler et al.
U.S. Appl. No. 17/457,207, filed Dec. 1, 2021, naming inventors Hammerschmidt et al.
U.S. Appl. No. 17/457,216, filed Dec. 1, 2021, naming inventors Kleeberger et al.
U.S. Appl. No. 17/457,221, filed Dec. 1, 2021, naming inventors Georgakos et al.

* cited by examiner

END-OF-LIFE PREDICTION FOR CIRCUITS USING ACCELERATED RELIABILITY MODELS AND SENSOR DATA

TECHNICAL FIELD

This disclosure relates to semiconductor circuits, and more specifically, circuits and technique for predicting the end of life of semiconductor circuits during use.

BACKGROUND

Semiconductor circuits are used in a wide variety of circuit applications in order to perform any of a variety of circuit functions. Unfortunately, semiconductor circuits can degrade over time. For example, aging, environmental exposure, stress, or other conditions can lead to semiconductor degradation and possibly circuit failure, which is undesirable. The amount of stress conditions applied to semiconductor circuits strongly varies from case to case. As a result, the actual operational lifetime of a semiconductor circuit may be unpredictable.

In many situations, semiconductor circuits may be designed to tolerate a worst-case mission profile during the lifetime of a system into which the circuit will be installed (e.g., a vehicle). Only a small percentage of devices will actually be exposed to the worst-case mission profile. Consequently, many semiconductor circuits are overdesigned with respect to their actual mission profile, which can increase development or production costs associated with the semiconductor circuits.

SUMMARY

This disclosure describes techniques and circuits capable of assessing aging effects in the circuits and predicting future problems in the circuits before they occur. In particular, the circuits may include a lifetime model unit that can estimate a remaining life of the circuits, e.g., based on an accelerated reliability model and sensed data associated with the circuits. The described circuits and techniques may be used with a wide variety of circuits designed for a wide variety of different circuit functions. The techniques and circuits described in this disclosure may provide predictive alerts that can predict future circuit problems before they actually occur in functional circuits. In this way, system maintenance can be identified and performed (e.g., to replace functional circuits within a larger system) before they exhibit actual problems or failure. The circuits and techniques of this disclosure may promote safety and reliability in devices or systems, such as in a vehicle or a similar setting.

In one example, this disclosure describes a circuit that comprises a circuit function unit configured to perform a circuit function; one or more sensors associated with the circuit function unit; and a lifetime model unit configured to estimate a remaining life of the circuit. The lifetime model unit may be configured to: receive sensor data from the one or more sensors and estimate the remaining life of the circuit based on an accelerated reliability model and the sensor data, wherein the sensor data comprises input to the accelerated reliability model.

In another example, this disclosure describes a method that comprises performing a circuit function via a circuit function unit of a circuit; receiving sensor data from one or more sensors associated with the circuit function unit; and estimating a remaining life of the circuit based on an accelerated reliability model and the sensor data, wherein the sensor data comprises input to the accelerated reliability model.

In another example, this disclosure describes a system that comprises a first circuit, a second circuit, and a system lifetime model unit. The first circuit may comprise a first circuit function unit configured to perform a first circuit function; one or more first sensors associated with the first circuit function unit; and a first lifetime model unit configured to estimate a remaining life of the first circuit. The first lifetime model unit may be configured to: receive first sensor data from the one or more first sensors and estimate the remaining life of the first circuit based on an accelerated reliability model and the first sensor data, wherein the first sensor data comprises first input to the accelerated reliability model. The second circuit may include a second circuit function unit configured to perform a second circuit function, one or more second sensors associated with the second circuit function unit; and a second lifetime model unit configured to estimate a remaining life of the second circuit. The second lifetime model unit may be configured to: receive second sensor data from the one or more second sensors and estimate the remaining life of the second circuit based on the accelerated reliability model and the second sensor data, wherein the second sensor data comprises second input to the accelerated reliability model. The system lifetime model unit may be configured estimate a remaining life of the system based on the estimate of the remaining life of the first circuit and the estimate of the remaining life of the second circuit.

The details of one or more examples are set forth in the accompanying drawings and the description below. Other features, objects, and advantages will be apparent from the description and drawings, and from the claims.

DETAILED DESCRIPTION

This disclosure describes techniques and circuits for assessing aging effects in circuits and for predicting future problems in circuits before the problems actually occur. In particular, according to this disclosure, a circuit may include a lifetime model unit that can estimate a remaining lifetime of the circuit, e.g., based on an accelerated reliability model and sensed data associated with the circuit. The described techniques and circuits may help to promote circuit safety and reliability within a larger system. The described circuits and techniques may be used with a wide variety of circuits designed for a wide variety of different circuit functions.

The circuits and techniques of this disclosure may promote safety and reliability in a vehicle or a similar setting. Modern vehicles and other modern devices or systems may include a large number of functional circuits and monitoring the health or operational safety of any of a wide variety of functional circuits is desirable to promote safety and reliability vehicles or other devices or systems. The circuits described herein may rely on sensed data associated with a circuit and an accelerated reliability model for the circuit, in order to estimate a remaining life of the circuit.

In some examples, the techniques and circuits described in this disclosure may provide predictive alerts that can predict circuit problems before the problems actually occur in a functional circuit that is configured to perform a circuit function. In this way, system maintenance can be identified and performed (e.g., to replace a circuit in the system) before the circuit exhibits actual problems or failure due to end-of-life.

In some cases, the techniques and circuits of this disclosure for estimating end-of-life may be used in combination with other techniques that detect or monitor for actual circuit problems that may currently exist. Accordingly, in some examples, the techniques of this disclosure may generate system alerts in response to identifying actual existing problems with a functional circuit, and the techniques of this disclosure may also generate predictive system alerts based on end-of-life analysis, in order to predict future problems with the functional circuit (e.g., to prompt anticipatory maintenance on the system).

Figure 1:
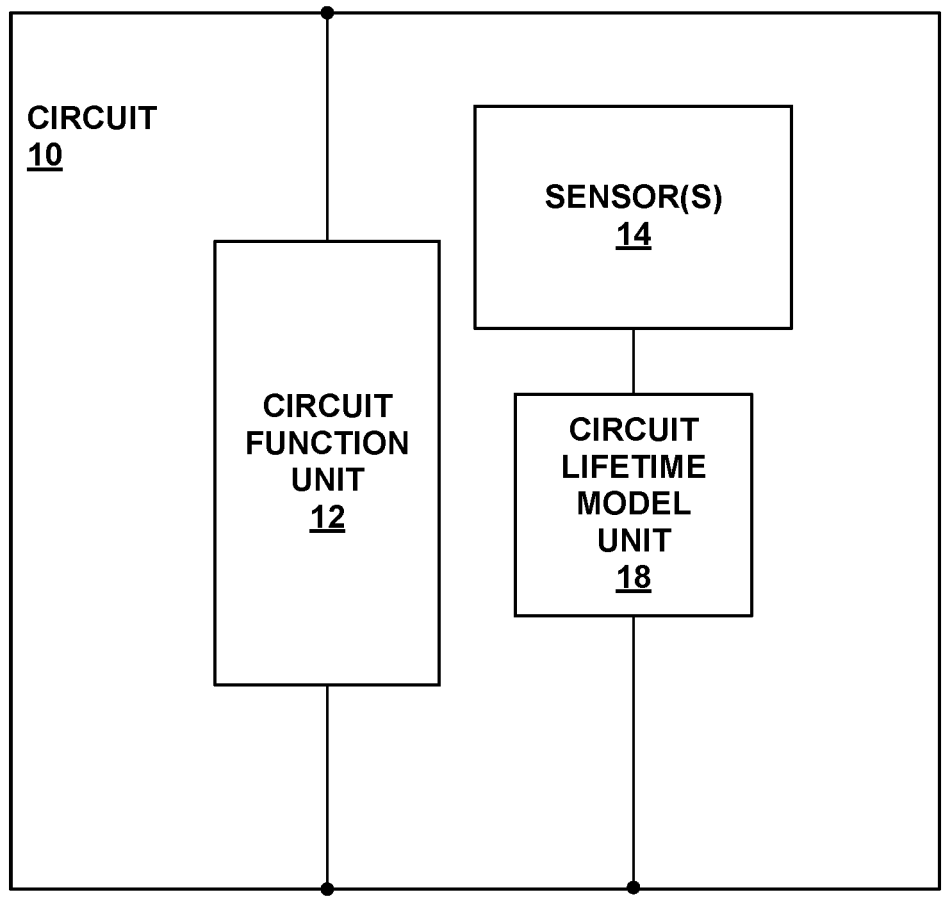
FIG. 1 is a block diagram showing a circuit according to an example of this disclosure.

FIG. 1 is a block diagram of a circuit 10 (e.g., an integrated circuit) that comprises a circuit function unit 12 configured to perform a circuit function. Circuit function unit 12 may comprise any of a wide variety of circuits used in a larger system. For example, circuit function unit 12 may comprise a driver circuit configured to drive a load. In another example, circuit function unit 12 may comprise a logic circuit configured to perform one or more logic functions. In another example, circuit function unit 12 may comprise a motor driver configured to drive a motor such as a multi-phase motor. In another example, circuit function unit 12 may comprise an oscillator circuit configured to generate an oscillating signal. In another example, circuit function unit 12 may comprise a level shifter circuit configured to shift or change the voltage level of a signal. In another example, circuit function unit 12 may comprise a phase shift circuit configured to shift the phase of a signal. In another example, circuit function unit 12 may comprise a phase locked loop circuit configured to provide an output signal having a phase that is based on the input signal. In another example, circuit function unit 12 may comprise an analog-to-digital converter (ADC) circuit configured to convert an analog signal to a digital signal. In another example, circuit function unit 12 may comprise a digital-to-analog converter (DAC) circuit configured to convert a digital signal to an analog signal. In another example, circuit function unit 12 may comprise an arithmetic logic unit (ALU) configured to perform an arithmetic function. In still other examples, circuit function unit 12 may comprise a processor, a microcontroller, a digital signal processor (DSP), a communication interface circuit such as a serial peripheral interface (SPI) or another type of communication interface circuit, a digital logic circuit, a state machine, a signal processing circuit, a control circuit, an analog function circuit, a memory circuit, a sensor, a sensor combined with at least a part of its readout and signal processing circuit, a communication interface or any other circuit configured to perform one or more circuit functions.

As shown in FIG. 1, circuit 10 may comprise lifetime model unit 18 and one or more sensors 14 associated with circuit function unit 12. Lifetime model unit 18 may be configured to estimate a remaining life of circuit 10 or to estimate a remaining life of circuit function unit 12. In particular, lifetime model unit 18 may be configured to receive sensor data from the one or more sensors 14 and estimate the remaining life of circuit 10 or circuit function unit 12 based on an accelerated reliability model and the sensor data, wherein the sensor data comprises input to the accelerated reliability model.

The type of sensors 14 used in circuit 10 may depend on the type of accelerated reliability model applied by lifetime model unit 18. In some examples, the one or more sensors 14 may include one or more temperature sensors, in which case the sensor data may comprise temperature data indicative of the temperature in or around circuit function unit 12. In this case, for example, lifetime model unit 18 may apply an accelerated reliability model that comprises a Coffin-Manson model, or an Arrhenius model, both of which may model circuit 10 (or circuit function unit 12) and allow for end-of-life prediction based on measured temperature data associated with circuit 10 (or circuit function unit 12). In other examples, the one or more sensors 14 may include one or more temperature sensors and one or more humidity sensors, in which case the sensor data comprises temperature data and humidity data. In this case, for example, lifetime model unit 18 may apply an accelerated reliability model that comprises Hallberg-Peck model, which may model circuit 10 (or circuit function unit 12) and allows for end-of-life prediction based on measured temperature data and measured humidity data associated with circuit 10 (or circuit function unit 12). In still other examples, other types of sensors (or other types of inputs) may provide voltage measurements to lifetime model unit 18, such as an over-voltage measurement or an undervoltage measurement. Also, in other examples, other types of sensors (or other types of inputs) may provide one or more current measurements to lifetime model unit 18. One or more measurements of drift, voltage changes, clock changes, current changes, electromigration, or other factors or measurements may be input to an accelerated reliability model used by lifetime model unit 18 for modeling circuit life based on these factors. Current migration and temperature measurements, for example, could lead to wear according to a model applied by lifetime model unit 18 that uses a current migration model that is dependent on temperature measurement and a current measurement.

In some examples, lifetime model unit 18 may be configured to identify events associated with sensor data, e.g., events associated with sensed data that satisfies some threshold or condition. In this case, lifetime model unit 18 may be configured to define events associated with the sensor data and determine an amount of wear associated with circuit 10 (or circuit function unit 12) based on the events. Event-based modeling may have the advantage of not needing a system clock to identify the events, or possibly using a lower quality clock than that used for other system functions in order to detect events. In this case, a clock signal may not be needed to determine wear of circuit 10 based on detected events.

In some examples, lifetime model unit 18 may be configured to estimate the remaining life of circuit 10 (or circuit function unit 12) by applying an accelerated reliability model based on events defined by the sensor data from sensors 14, aggregate burdens associated with the events, and define the amount of wear associated with the circuit based on the aggregated burdens. In some cases, different events may map to different levels of burdens, and the totality of burdens associated with a totality of detected events may be used to define a level of wear in circuit 10 (or circuit function unit 12).

In some examples, lifetime model unit 18 may be configured to disable circuit 10 (or disable circuit function unit 12) in response to the estimate of the remaining life of circuit 10 (or the remaining life of circuit function unit 12) being less than a threshold. In addition, circuit 10 (e.g., lifetime model unit 18 within circuit 10) may be configured to issue an alert in response to the estimate of the remaining life being less than a threshold. Also, in some examples, the estimate of the remaining life may comprise a continuous value (e.g., a percentage or level), in which case, system level decisions regarding circuit replacement can be made at the system-level based on the continuous value (e.g., the percentage or level).

In some examples, lifetime model unit 18 may be configured to communicate a predictive maintenance alert (e.g., an end-of-life notice) to another circuit, such as an electronic control unit (ECU), a system-level microprocessor or any external system-level circuit. Based on the predictive maintenance alert, the system may schedule, suggest, or require maintenance for or replacement of circuit 10 or circuit function unit 12 within a larger system, such as a vehicle.

In some examples, circuit function unit 12, the one or more sensors 14, and the lifetime model unit 18 may comprise separate circuit modules within a circuit package. The circuit package, for example, may be housed in a molding compound. In this way, circuit 10 may comprise a self-contained circuit package with end-of-life determination capabilities. In other examples, a circuit package could also be used for circuit function unit 12 and lifetime model unit 18, with one or more sensors 14 being external to but associated with the circuit package. Also, in other examples, circuit function unit 12, lifetime model unit 18 and sensors 14 may each comprise separate circuit packages that are assembled to create circuit 10. However, it may be especially useful to house circuit function unit 12 and the lifetime model unit 18 within a molding compound to define a self-contained circuit package with end-of-life determination capabilities. In this case, sensors 14 may also be contained within the package, or may be external to the package.

Figure 2:
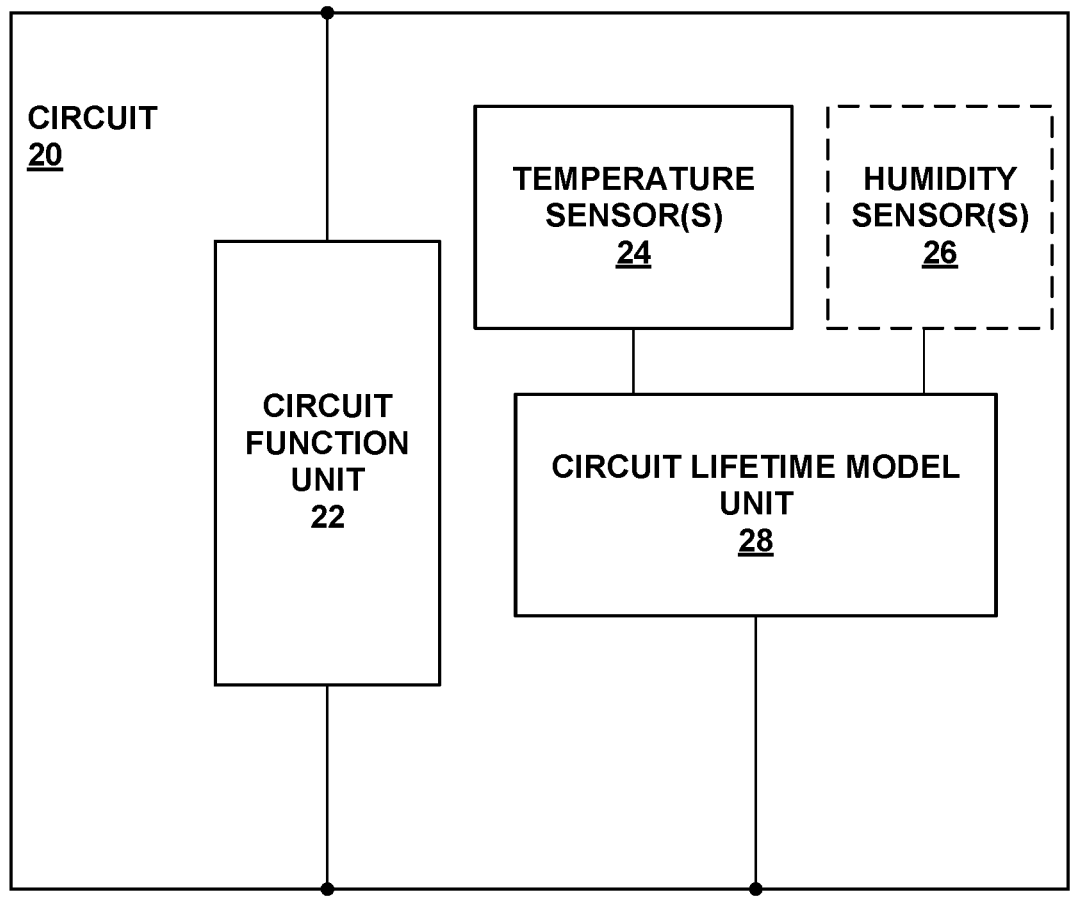
FIG. 2 is another block diagram showing a circuit according to an example of this disclosure.

FIG. 2 is another block diagram of a circuit 20 (e.g., an integrated circuit), which is similar to circuit 10 of FIG. 1 in many respects. Whereas circuit 10 of FIG. 1 includes one or more sensor(s) 14, circuit 20 of FIG. 2 includes one or more temperature sensors 24, and optionally, one or more humidity sensors 26.

Like circuit 10 of FIG. 1, circuit 20 of FIG. 2 comprises a circuit function unit 22 configured to perform a circuit function. Circuit function unit 22 may comprise a driver circuit, a logic circuit, a motor driver, an oscillator circuit, a level shifter circuit, a phase shift circuit, a phase locked loop circuit, an ADC circuit, a DAC circuit, an ALU, a processor, a microcontroller, a DSP, a communication interface circuit such as an SPI or another type of communication interface circuit, a digital logic circuit, a state machine, a signal processing circuit, a control circuit, an analog function circuit, a memory circuit, a sensor or any other circuit configured to perform one or more circuit functions.

Whether circuit 20 only includes temperature sensor(s) 24 or includes both temperature sensor(s) 24 and humidity sensor(s) 26 may depend on the type of accelerated reliability model applied by lifetime model unit 28. One or more temperature sensors 24 may provide temperature data to circuit lifetime model unit 28 indicative of the temperature in or around circuit function unit 22. In this case, for example, lifetime model unit 28 may apply an accelerated reliability model that comprises a Coffin-Manson model, or an Arrhenius model, both of which may model circuit 20 (or model circuit function unit 22) and allow for end-of-life prediction based on measured temperature data associated with circuit 20 (or circuit function unit 22). In other examples, circuit may include both one or more temperature sensors 24 and one or more humidity sensors 26, in which case the sensor data provided to circuit lifetime model unit 28 comprises both temperature data and humidity data. In this case, for example, lifetime model unit 28 may apply an accelerated reliability model that comprises Hallberg-Peck model, which may model circuit 20 (or model circuit function unit 22) and allow for end-of-life prediction based on measured temperature data and measured humidity data associated with circuit 20 (or circuit function unit 22).

Again, as noted above, in still other examples, other types of sensors (or other types of inputs) may provide voltage measurements to lifetime model unit 28, such as an overvoltage measurement or an undervoltage measurement. Also, in other examples, other types of sensors (or other types of inputs) may provide one or more current measurements, power measurements, or other types of measurements, to lifetime model unit 28. One or more measurements of drift, voltage changes, clock changes, current changes, electromigration, or other factors or measurements may be input to an accelerated reliability model used by lifetime model unit 28 for modeling circuit life based on these factors. Current migration and temperature measurements, for example, could lead to wear according to a model applied by lifetime model unit 28 that uses a current migration model that is dependent on temperature measurement and a current measurement.

In some examples, lifetime model unit 28 may be configured to identify events associated with sensor data, e.g., events associated with sensed data that satisfies some threshold or condition. For example, measured temperature above a threshold may define an event, or measured temperature over a threshold for a defined amount of time may define an event, or measured temperature below a threshold may define an event, measured temperature below a threshold for a defined amount of time may define an event, or a time rate of change of temperature (e.g., a first derivative of temperature). Also, specifically measured temperatures (or temperatures above or below a threshold) at one or more locations within circuit 20 may define an event.

Similarly, in some examples, measured relative humidity above a threshold may define an event, or measured relative humidity over a threshold for a defined amount of time may define an event, or measured relative humidity below a threshold may define an event, measured relative humidity below a threshold for a defined amount of time may define an event, or a time rate of change of temperature (e.g., a first derivative of temperature). Also, specifically measured relative humidity (or humidity above or below a threshold) at one or more locations within circuit 20 may define an event.

Also, specific combinations of temperature and humidity (e.g., above or below thresholds) may define events. Moreover, other factors can be used for modeling a circuit 20 (or circuit function unit 22), and therefore, other types of sensed events could be defined by lifetime model unit 28, such as an overvoltage measurement or an undervoltage measurement. Also, in other examples, other types of sensors (or other types of inputs) may provide one or more current measurements to lifetime model unit 28, which could be used to define events (possibly in combination with measured temperature and/or humidity). One or more measurements of drift, voltage changes, clock changes, current changes, electromigration, or other factors or measurements may be input to an accelerated reliability model used by lifetime model unit 28 for modeling circuit life based on these factors. Current migration and temperature measurements, for example, could lead to wear according to a model applied by lifetime model unit 28 that uses a current migration model that is dependent on temperature measurement event and a current measurement event.

Event-based modeling of circuit 20 (or circuit function unit 22) by circuit lifetime model unit 28 may have the advantage of not needing a system clock to identify the events, or possibly using a lower qualify clock than that used for other system functions in order to detect events. In this case, a clock signal may not be needed to determine wear of circuit 20 based on detected events.

In some examples, lifetime model unit 28 may be configured to estimate the remaining life of circuit 20 by applying an accelerated reliability model based on events defined by the sensor data from sensors 24, aggregate burdens associated with the events, and define the amount of wear associated with the circuit based on the aggregated burdens. In some cases, different events may map to different levels of burdens, and the totality of burdens associated with a totality of detected events may be used to define a level of wear in circuit 20 (or circuit function unit 22).

As with circuit 10 of FIG. 1, with circuit 20 of FIG. 2, in some examples, lifetime model unit 28 may be configured to disable circuit 20 (or disable circuit function unit 22) in response to the estimate of the remaining life of circuit 20 (or the remaining life of circuit function unit 22) being less than a threshold. In addition, circuit 20 (e.g., lifetime model unit 28 within circuit 20) may be configured to issue an alert in response to the estimate of the remaining life being less than a threshold. Also, in some examples, the estimate of the remaining life of circuit 20 may comprise a continuous value (e.g., a percentage or level), in which case, system level decisions regarding circuit replacement can be made at the system-level based on the continuous value (e.g., the percentage or level).

In some examples, lifetime model unit 28 may be configured to communicate a predictive maintenance alert (e.g., an end-of-life notice) to another circuit, such as an ECU, a system-level microprocessor or any external system-level circuit. Based on the predictive maintenance alert, the system may schedule, suggest, or require maintenance for or replacement of circuit 20 or circuit function unit 22 within a larger system, such as a vehicle.

In some examples, circuit function unit 22, temperature sensor(s) 24, humidity sensor(s), and lifetime model unit 28 may comprise separate circuit modules within a circuit package. The circuit package, for example, may be housed in a molding compound. In this way, circuit 20 may comprise a self-contained circuit package with end-of-life determination capabilities. In other examples, a circuit package could also be used for circuit function unit 22 and lifetime model unit 28, with some or all of temperature sensor(s) 24 and humidity sensor(s) being external to but associated with the circuit package. Also, in other examples, circuit function unit 22, lifetime model unit 28, temperature sensors 24 and humidity sensors 26 may each comprise separate circuit packages that are assembled to create circuit 20. However, similar to circuit 10 above, with circuit 20, it may be especially useful to house circuit function unit 22 and the lifetime model unit 28 within a common molding compound in order to define a self-contained circuit package with end-of-life determination capabilities. In this case, either or both of temperature sensor(s) 24 and/or humidity sensor(s) 26 may also be contained within the package, or may be external to the package.

For safety related applications, e.g. in the automotive industry, it is desirable to know when a device (e.g., a circuit) has reached its end-of-life. If this is the case, the safety of the product (e.g., the vehicle) can be improved by identifying whether a certain safety function (e.g., electric steering) is nearing its end of circuit life. Predicting when a device will reach its end-of-life, however, can be difficult. Once the end-of-life is known, a reaction to the near end-of-life status can take place, such as repair or replacement of the circuit.

During development of a device or circuit, accelerated reliability tests may be conducted in order to make sure that the end-of-life is not reached within a timeframe associated with a general mission profile. There are acceleration models available to correlate circuit tests with the mission profile.

An analysis can be performed using modeled computation of the actual usage profile, and this computation can be compared with a maximum allowed stress for the circuit. The analysis may provide a ratio (e.g., a percentage) of the real load or stress on the circuit with the maximum allowed load or stress. Taking into account other inputs (like mission profile or history), a time span until end-of-life can be predicted.

This disclosure contemplates real-time modeling within a circuit 10, 20 during its use in the field. This way, end-of-life can be modeled and predicted by a lifetime model unit 18, 28 in a way that takes real usage data into account.

For many kinds of circuit burdens, there are acceleration models available. Some accelerated reliability models rely on temperature, while others rely on temperature and relative humidity. Still other may rely on one or more other influences on circuit reliability.

The circuits and techniques of this disclosure may utilize one or more accelerated reliability models in order to perform a continuous weighted cumulation of the burden (B) based on measured data from input sensors. The weighted cumulation of the burden (B) may be compared to a maximum allowed burden $B_{max}$. This comparison may result in a percentage, which can be referred to as "wear" (w). When the wear of 100% is reached, a system-level reaction can take place to identify that the circuit has reached its end-of-life. In some cases, a margin can be used, such that the end-of-life threshold corresponds to something less than 100% wear, in order to reflect statistical considerations (e.g. from an $\chi^2$ distribution or other statistical metric).

In order to determine the reliability of any specific type of device or circuit, a sufficient number of devices can be tested during the product development so as to ensure that none (or a significantly small percentage) of the devices will be destroyed within a given mission profile.

Figure 3:
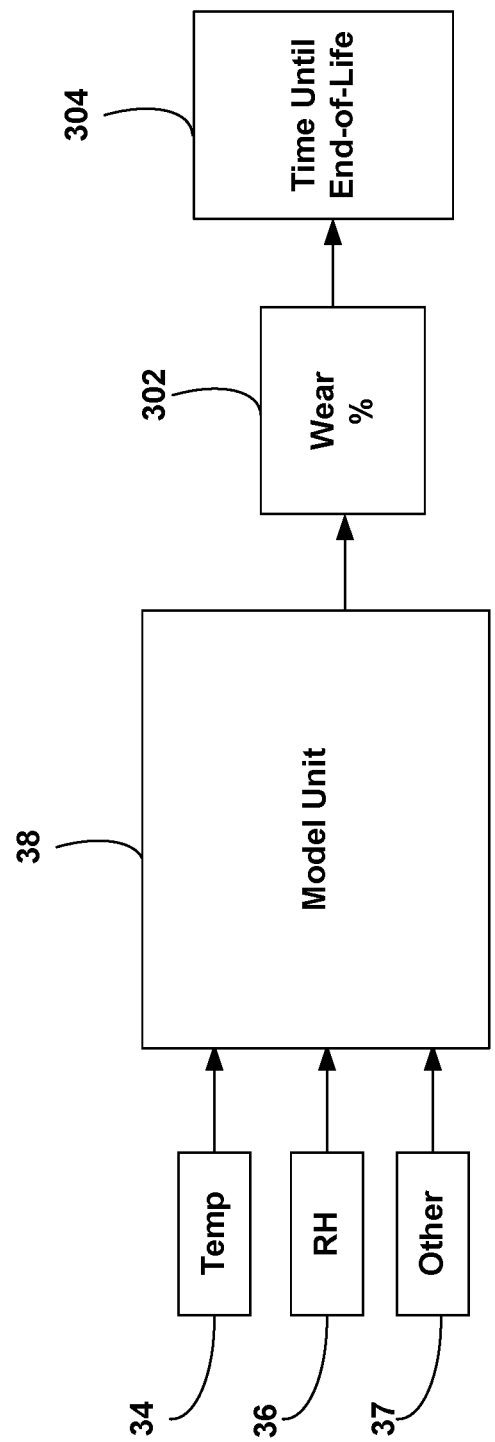
FIG. 3 is a block diagram showing sensors and a circuit lifetime model unit that can be implemented within circuit or circuit package.

FIG. 3 is another block diagram showing sensors 34, 36, 37 and a circuit lifetime model unit 38 that can be implemented within circuit or circuit package. For example, circuit lifetime model unit 38 may receive one or more measured inputs from a temperature sensor 34, a relative humidity sensor 36, or possibly other sensors 37 or other inputs that can be used for circuit modeling. Circuit lifetime model unit 38 may apply an accelerated reliability model based on sensed data in order to define an amount of wear 302. The amount of wear 302, in turn, can be used to define an amount of remaining time until the predicted end-of-life of the circuit. In some cases, elements 302 and 304 can be considered part of circuit lifetime model unit 38, but the elements are shown separately for illustrative purposes.

In some examples, circuit lifetime model unit 18, 28, 38 may apply a so-called Coffin-Manson model. In this case, the following equations may be applied by circuit lifetime model unit 18, 28, 38 in accordance with the Automotive Electronics Council (AEC) Q100 rev. H, Table A7.1:

$$A_f = \left(\frac{\Delta T_t}{\Delta T_u}\right)^m n_t = \frac{n_u}{A_f},$$

where $A_f$ is the acceleration factor, $n_t$ is the number of thermal events identified during a test, $n_u$ is the number of thermal events during usage, AT is the temperature difference of the thermal event (index t for test and index u for usage) and m is the exponent that depends on the material of the circuit (e.g. m=4). AEC—Q100—Rev.H is available at: http://www.aecouncil.com/Documents/ AEC_Q100_Rev_H_B ase_Document.pdf Circuit lifetime model unit 18, 28, 38 may perform an aggregation of burdens after each burden is normalized to the same stress conditions, e.g. the test conditions ("t") according to the following equation.

$$B = \sum_i B_i = \sum_i n_{t,i} = \sum_i \frac{n_{u,i}}{A_{f,i}} = \sum_i n_{u,i}\left(\frac{\Delta T_{u,i}}{\Delta T_t}\right)^m$$

During usage of a circuit, there may not be groups of thermal events with a number $n_{u,i}$, and therefore, in some examples, the groups quantity can be set to 1 and summed over each single thermal event.

The "cumulated burden" B can be given by:

$$B = \sum_i \left(\frac{\Delta T_{u,i}}{\Delta T_t}\right)^m$$

where the sum is over all single thermal events, numbered by i. For the test with $N_t$ times repeated under the same conditions, these equations may reduce to $B_{max}=N_t$, because $\Delta T_{u,i}=\Delta T_t$. In this case, the wear may be defined as $w=B/B_{max}$.

In other examples, circuit lifetime model unit 18, 28, 38 may apply a so-called Hallberg-Peck model. In this case, the following equations may be applied by circuit lifetime model unit 18, 28, 38 in accordance with AEC Q100 rev. H, Table A7.1:

$$A_f = \left(\frac{RH_i}{RH_n}\right)^F \cdot \exp\left[\frac{E_a}{k_b}\cdot\left(\frac{1}{T_u}-\frac{1}{T_i}\right)\right] t_t = \frac{t_u}{A_f}$$

where $A_f$ is the acceleration factor, $t_t$ is the time of test, $t_u$ is the time of usage, T is the absolute temperature in Kelvin (index t for test and index u for usage), RH is the relative humidity (index t for test and index u for usage), p is the Peck exponent depending on the failure mechanism (e.g. p=3), $E_a$ is the activation energy and $k_B$ is Boltzmann's constant.

In some examples, an aggregation of burdens can be performed by circuit lifetime model unit 18, 28, 38 after each burden is normalized to the same stress conditions, e.g. the test conditions ("t").

$$B = \sum_i B_i = \sum_i t_{t,i} = \sum_i \frac{t_{u,i}}{A_{f,i}}$$

Since time is not discrete with the Hallberg-Peck model, unlike the Coffin-Manson model, with the Hallberg-Peck model, circuit lifetime model unit 18, 28, 38 may integrate over the time to define burden (B) as follows:

$$B = \frac{\exp\frac{E_a}{k_B T_t}}{RH_t^p}\int_0^{t_c} RH_u^p(t)\exp\left(-\frac{E_a}{k_B T_u(t)}\right)dt$$

where the start of operation time is set to 0, and $t_c$ is the current time.

$B_{max}$ can be defined by using the $t_c=t_t$, $T_u(t)=T_t$ and $RH_u(t)=RH_t$ $$B_{max}=t_t$$

For practical reasons the integration can be done as a summation, considering techniques to avoid numerical cancellation, e.g. a Kahan-summation or a Klein-summation.

In other examples, circuit lifetime model unit 18, 28, 38 may apply a so-called Arrhenius model. In this case, lifetime model unit 18, 28, 38 may apply similar equations as those used above for the Hallberg-Peck model, but set p=0. In this way, circuit lifetime model unit 18, 28, 38 can determine B, $B_{max}$ and w.

Upon determining B, $B_{max}$ and w according the Arrhenius model, the Hallberg-Peck model, the Coffin-Manson-model or another accelerated reliability model, lifetime model unit 18, 28, 38 may execute a scheme for end-of-life prediction.

In some examples of end-of-life prediction, lifetime model unit 18, 28, 38 may use history associated the circuit (e.g., circuit 10, circuit function unit 12, circuit 20, or circuit function unit 22). The average burden can be defined as $B/t_c$. The calculation may assume that the average stays the same and lifetime model unit 18, 28, 38 may extrapolate:

$$B_{max}=B/t_c*t_E$$

where $t_E$ is the end-of-life time. Therefore, $$t_E=B_{max}/B*t_c$$

and the remaining time until end-of-life can be given by $$t_r=t_E-t_c=t_c*(B_{max}/B-1)$$

For the Coffin-Manson-model example, the time for the future can by determined in the same way, but assuming an average amount of thermal events per time.

In another example of end-of-life prediction, lifetime model unit 18, 28, 38 may use a mission profile associated with the circuit for the future. In this case, an assumption can be used that in the future the burden will be that defined by a mission profile for the circuit. In this case:

$$B+B_m/t_m*t_r=B_{max}$$

where $B_m$ is the total burden of the mission profile (computed using the formulas for B from above) and $t_m$ is the time of the mission profile. Hence, $$t_r = (B_{max} - B)/B_m * t_m$$

Figure 4:
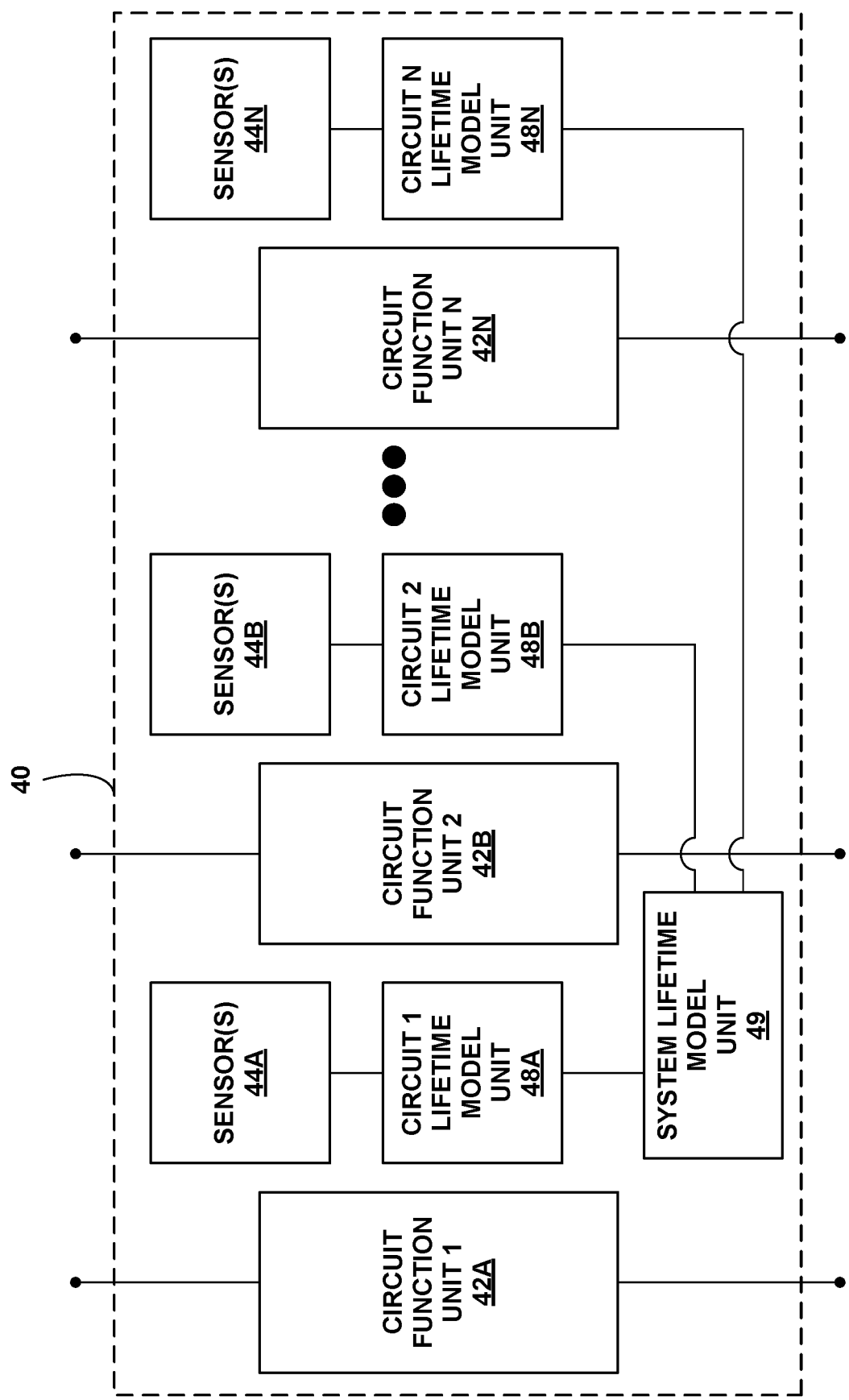
FIG. 4 is a block diagram showing a circuit system that includes several circuit function units, several circuit lifetime model units, and a system lifetime model unit configured to estimate a remaining circuit life of the entire circuit system.

In some cases, the techniques and circuits of this disclosure may be used for a plurality of circuits within a larger device or system. In such cases, each circuit may include its own lifetime model unit, and a device-level or system level unit may predict or define the end-of-life of the device or system based on the end-of-life analysis associated with each of the plurality of circuits within the larger device or system FIG. 4 is a block diagram showing a circuit system 40 (e.g., a device) that includes several circuit function units 42A, 42B, 42N, several circuit lifetime model units 48A, 48B, 48N that receive sensed data from sensors 44A, 44B, 44N, and a system lifetime model unit 49 configured to estimate a remaining circuit life of the entire circuit system. In FIG. 4, the letter N may refer to any positive integer, meaning that any number (N) of circuit function units and any number of circuit lifetime model units could be implemented within circuit system 40.

Circuit function units 42A, 42B, 42N may each be configured to perform a circuit function, which may be similar or different circuit functions. Circuit function units 42A, 42B, 42N may each comprise a driver circuit, a logic circuit, a motor driver, an oscillator circuit, a level shifter circuit, a phase shift circuit, a phase locked loop circuit, an ADC circuit, a DAC circuit, an ALU, a processor, a microcontroller, a DSP, a communication interface circuit such as an SPI or another type of communication interface circuit, a digital logic circuit, a state machine, a signal processing circuit, a control circuit, an analog function circuit, a memory circuit, a sensor or any other circuit configured to perform one or more circuit functions.

As shown in FIG. 4, circuit system 40 may comprise circuit lifetime model units 48A, 48B, 48N that receive sensed data from sensors 44A, 44B, 44N. Each of circuit lifetime model units 48A, 48B, 48N may be associated respectively with circuit function units 42A, 42B, 42N. Sensors 44A, 44B, 44N may be different, or in some examples, one or more of the same sensors may be used by lifetime model units 48A, 48B, 48N.

Lifetime model unit 48A may be configured to estimate a remaining life of circuit function unit 42A. Lifetime model unit 48B may be configured to estimate a remaining life of circuit function unit 42B. Lifetime model unit 48N may be configured to estimate a remaining life of circuit function unit 42N. In particular, each lifetime model unit 48A, 48B, and 48N may be configured to receive sensor data from the one or more sensors 44A, 44B, 44N and estimate the remaining life of the respective circuit function unit 42A, 42B, -42N based on an accelerated reliability model and the sensor data, wherein the sensor data comprises input to the accelerated reliability model.

Thus, circuit system 40 comprises a first circuit that includes a first circuit function unit 42A configured to perform a first circuit function, one or more first sensors 44A associated with the first circuit function unit 42A, and a first lifetime model unit 48A configured to estimate a remaining life of the first circuit, wherein the first lifetime model unit 48A is configured to: receive first sensor data from the one or more first sensors 44A, and estimate the remaining life of the first circuit based on an accelerated reliability model and the first sensor data, wherein the first sensor data comprises first input to the accelerated reliability model. In addition, circuit system 40 comprises a second circuit that includes a second circuit function unit 42B configured to perform a second circuit function, one or more second sensors 44B associated with the second circuit function unit 42B, and a second lifetime model unit 48B configured to estimate a remaining life of the second circuit, wherein the second lifetime model unit 48B is configured to: receive second sensor data from the one or more second sensors 44B, and estimate the remaining life of the second circuit based on the accelerated reliability model and the second sensor data, wherein the second sensor data comprises second input to the accelerated reliability model.

Circuit system 40 may further include a system lifetime model unit 49 configured to estimate a remaining life of the system based on the estimate of the remaining life of the first circuit and the estimate of the remaining life of the second circuit. For example, system lifetime model unit 49 may define the remaining system life as the minimum of the remaining life of the first circuit and the estimate of the remaining life of the second circuit, or system lifetime model unit 49 may perform a more detailed (e.g. statistical analysis) to estimate the remaining life of circuit system 40 based on the estimate of the remaining life of the first circuit and the estimate of the remaining life of the second circuit. The remaining time until end-of life of system 40 may comprise a synopsis of all contributing circuit lifetime model units 48A, 48B, -48N. In some cases, the minimum of all remaining times per model will be used to identify the remaining time until end-of-life of circuit system 40, although other more complicated methods, e.g., statistical predictions, could be used.

In FIG. 4, circuit function unit N 42N and circuit lifetime model unit N 48N use the label "N" to indicate that any number (N) of circuit function units and lifetime model units may be defined in a system. Thus, in FIG. 4, if more than two circuit function units are included in a circuit system, N may represent any positive integer greater than 2. Where N=3 or greater, for example, system 40 may comprise a third circuit that includes a third circuit function unit 42N configured to perform a third circuit function, one or more third sensors 44N associated with the third circuit function unit 42N, and a third lifetime model unit 48N configured to estimate a remaining life of the third circuit, wherein the third lifetime model unit 48N is configured to receive third sensor data from the one or more third sensors 44N, and estimate the remaining life of the third circuit based on the accelerated reliability model and the third sensor data, wherein the third sensor data comprises third input to the accelerated reliability model. In this case, system lifetime model unit 49 may be configured estimate the remaining life of circuit system 40 based on the estimate of the remaining life of the first circuit, the estimate of the remaining life of the second circuit, and the estimate of the remaining life of the third circuit.

In other words, in order to extend the techniques of this disclosure from a single circuit analysis to a more complex circuit system (e.g., a device with many circuits), wear can be determined for each single circuit in the circuit system and then aggregated in a suitable way (e.g. to detect the maximum wear of all devices). Alternatively, an averaging model can be used.

In some cases, it may be appropriate to limit the sensors in the system, even down to 1 temperature sensor. In such cases, the self-heating per device can be considered by additional model parameters, e.g., the load of the circuit (processing power, load current, or circuit-specific factors). The techniques of this disclosure may also be used for non-semiconductor systems. The prerequisite is only, that a model for accelerated testing is available (for whatever the end-of-life time has to be determined) and that sensors capture the main parameters of the model.

Figure 5:
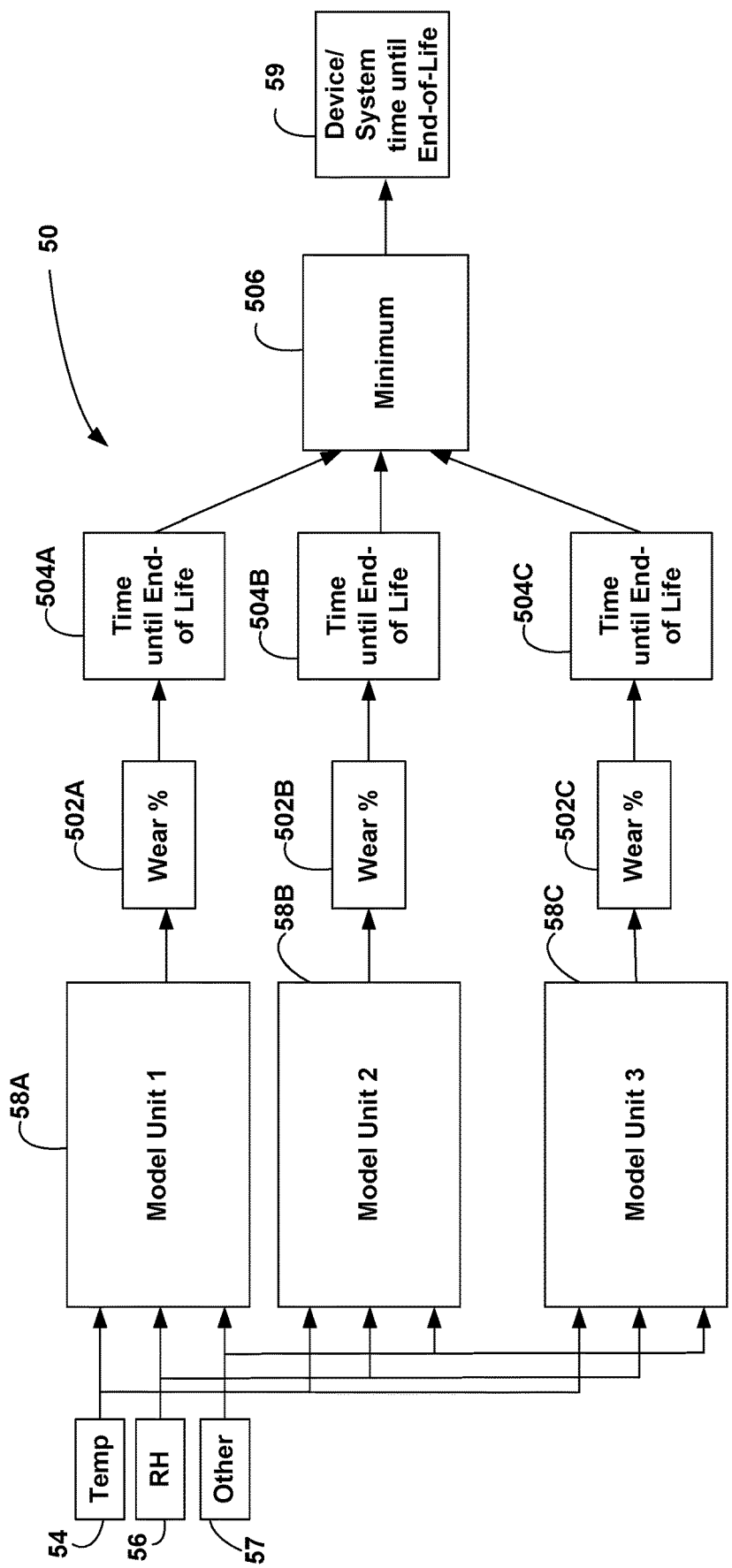
FIG. 5 is a block diagram of a device or system that includes sensors, a plurality of a circuit lifetime model units, and a device lifetime unit that may estimate a remaining life of a device or system based on a minimum life remaining for different circuits being modeled by the plurality of a circuit lifetime model units.

FIG. 5 is another block diagram depicting a circuit system 50, which may operate similarly to circuit system 40. One or more temperature sensor(s) 54, relative humidity sensor(s) 56, and/or other sensors 57 or inputs may provide input to model units 58A, 58B, 58C, which model end-of-life of associated functional circuit units based on an accelerated reliability model. Again, different models can be used, and therefore, different sensors and inputs may be used, consistent with this disclosure.

Based on the reliability models and the sensed data, model units 58A, 58B, 58C are configured to determine wear percentages 502A, 502B, and 502C for each associated different functional circuit units (not shown in FIG. 5) associated with circuit system 50. The determined wear percentages 502A, 502B, and 502C, then, can be used to define an estimation of time until end-of-life 504A, 504B, and 504C for each of the different functional circuit units (not shown in FIG. 5). In one specific example, the minimum value 506 among time until end-of-life 504A, 504B, and 504C can be selected to define the device/system time until end of life 59. As noted above, however, in other examples, more complicated methods, e.g., statistical predictions instead of minimum 506, could be used to define the device/system time until end of life 59 based on end-of-life 504A, 504B, and 504C defined for each individual circuit function unit.

Relative to techniques that compare parameters of a duplicated circuit (e.g., where one is operated normally and one is operated under a "less burden" condition), the techniques described herein may have advantages. For example, with the techniques of this disclosure, circuits may not need to be duplicated, which creates costs saving. Also, for some types of circuit function units and associated circuit parameters, in general, there may not currently be any available methods to assess aging.

In some examples, the acceleration models used or applied by circuit model units can be taken or defined based on models defined by standards like AEC Q100 rev. H, in which case no additional investigations or experiments may be needed to show accurate circuit life estimations. By leveraging models defined by an industry standard, circuit end-of-life the prediction can be based on acceptable industry standards. Moreover, due to the simplicity of some acceleration models, a circuit or system of this disclosure may require very few sensors (possibly only one sensor) for measuring physical parameters needed for modeling. In some cases, only time (or number) and temperature may be needed.

Figure 6:
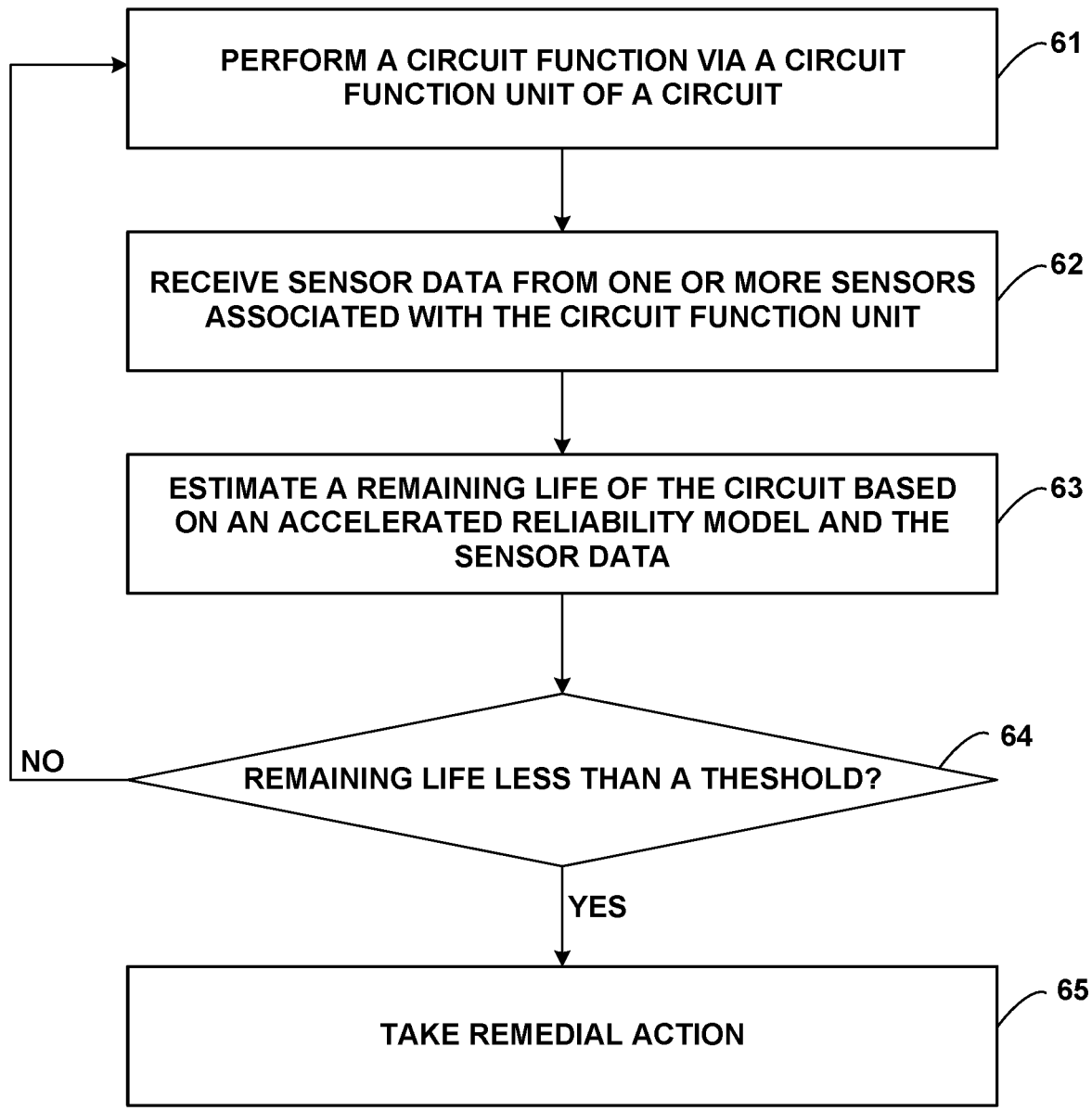
FIG. 6 is a flow diagram showing operation of a circuit according to an example of this disclosure.

FIG. 6 is a flow diagram showing operation of a circuit according to an example of this disclosure. FIG. 6 will be described from the perspective of circuit 10 shown in FIG. 1, although other circuits, devices or systems may perform the techniques of FIG. 6. As shown, circuit function unit 12 performs a circuit function for circuit 10 (61). A circuit lifetime model unit 18 within circuit 10 receives sensor data from one or more sensors 14 associated with the circuit function unit 12 (62) and estimates a remaining life of circuit 10 (or circuit function unit 12) based on an accelerated reliability model and the sensor data (63). For example, the sensor data may comprise input to the accelerated reliability model.

As discussed above, in some examples, the one or more sensors 14 include one or more temperature sensors, in which case the sensor data comprises temperature data. In this case, the accelerated reliability model may comprise a Coffin-Manson model or an Arrhenius model. Also, as discussed above, in other examples, the one or more sensors 14 may include one or more temperature sensors and one or more humidity sensors, in which case, the sensor data comprises temperature data and humidity data. In this case, for example, the accelerated reliability model may comprise a Hallberg-Peck model. Other types of sensor data, other types of input, and other types of models can also be used in accordance with this disclosure.

As further shown in FIG. 6, in some examples, circuit lifetime model unit 18 may determine whether the estimated remaining life of circuit 10 (or circuit function unit 12) is less than a threshold (64). This determination (64) may be based on an actual value of remaining life (e.g., an amount of time), an amount of wear, a percentage (e.g., a percentage of overall wear relative to an acceptable amount of wear or a percentage of the expected life of the circuit), or another metric indicative of the remaining life of circuit 10 (or circuit function unit 12).

In response to identifying that the remaining life of circuit 10 is less than a threshold (yes branch of 64), circuit lifetime model unit 18 may be configured to initiate remedial action for circuit 10 (or circuit function unit 12) (65). Remedial action (65), for example, may comprise outputting an alert or fault, disabling circuit 10 (or circuit function unit 12), disabling one or more components of a larger system, or other actions to promote safety or reliability in a larger system. In some examples, circuit lifetime model unit 18 may be configured to disable some or all of circuit 10 (e.g., disable circuit function unit 12) in response to the estimate of the remaining life being less than a threshold. In some examples, circuit lifetime model unit 18 may be configured to issue an alert in response to the estimate of the remaining life being less than a threshold. An alert from circuit lifetime model unit 18, for example, may comprises a predictive maintenance alert sent to another circuit, such as an ECU, a system-level microprocessor or any external system-level circuit. Based on the predictive maintenance alert, a larger system may schedule, suggest, or require maintenance on circuit 10 or circuit function unit 12, e.g., before the end-of-life is reached and/or before any actual safety issues occur due to aging of circuit 10.

As explained in detail above, in some examples, estimating a remaining life of circuit 10 (63) may include applying an accelerated reliability model based on events defined by the sensor data, aggregating burdens associated with the events; and defining an amount of wear associated with the circuit based on the aggregated burdens. These or other techniques may be used for the end-of-life estimation using an accelerated reliability model.

The following numbered clauses demonstrate one or more aspects of the disclosure.

Clause 1—A circuit comprising: a circuit function unit configured to perform a circuit function; one or more sensors associated with the circuit function unit; and a lifetime model unit configured to estimate a remaining life of the circuit, wherein the lifetime model unit is configured to: receive sensor data from the one or more sensors, and estimate the remaining life of the circuit based on an accelerated reliability model and the sensor data, wherein the sensor data comprises input to the accelerated reliability model.

Clause 2—The circuit of clause 1, wherein the one or more sensors include one or more temperature sensors, and wherein the sensor data comprises temperature data.

Clause 3—The circuit of clause 1 or 2, wherein the accelerated reliability model comprises a Coffin-Manson model.

Clause 4—The circuit of clause 1 or 2, wherein the accelerated reliability model comprises an Arrhenius model.

Clause 5—The circuit of clause 1, wherein the one or more sensors include one or more temperature sensors and one or more humidity sensors, and wherein the sensor data comprises temperature data and humidity data.

Clause 6—The circuit of clause 5, wherein the accelerated reliability model comprises a Hallberg-Peck model.

Clause 7—The circuit of any of clauses 1-6, wherein to estimate the remaining life, the lifetime model unit is configured to: define events associated with the sensor data; and determine an amount of wear based on the events.

Clause 8—The circuit of any of clauses 1-7, wherein to estimate the remaining life, the lifetime model unit is configured to: apply the accelerated reliability model based on the events defined by the sensor data; aggregate burdens associated with the events; and define the amount of wear associated with the circuit based on the aggregated burdens.

Clause 9—The circuit of any of clauses 1-8, wherein the circuit is configured to disable the circuit in response to an estimate of the remaining life being less than a threshold.

Clause 10—The circuit of any of clauses 1-9, wherein the circuit is configured to issue an alert in response to the estimate of the remaining life being less than a threshold.

Clause 11—The circuit of any of clauses 1-10, wherein the circuit function unit, the one or more sensors, and the lifetime model unit comprise separate circuit modules within a circuit package.

Clause 12—The circuit of any of clauses 1-11, wherein circuit function unit comprises one or more circuit units selected from a group consisting of: a load driver circuit; a logic circuit; a motor driver; an oscillator circuit; a level shifter circuit; a phase shift circuit; a phase locked loop circuit; an analog-to-digital converter circuit; a digital-to-analog converter circuit; an ALU; a processor; a microcontroller; a DSP; a communication interface circuit; a digital logic circuit; a state machine; a signal processing circuit; a control circuit; an analog function circuit; a sensor; or a memory circuit.

Clause 13—A method comprising: performing a circuit function via a circuit function unit of a circuit; receiving sensor data from one or more sensors associated with the circuit function unit; and estimating a remaining life of the circuit based on an accelerated reliability model and the sensor data, wherein the sensor data comprises input to the accelerated reliability model.

Clause 14—The method of clause 13, wherein the one or more sensors include one or more temperature sensors, and wherein the sensor data comprises temperature data.

Clause 15—The method of clause 13 or 14, wherein the accelerated reliability model comprises a Coffin-Manson model or an Arrhenius model.

Clause 16—The method of clause 13, wherein the one or more sensors include one or more temperature sensors and one or more humidity sensors, and wherein the sensor data comprises temperature data and humidity data.

Clause 17—The method of clause 16, wherein the accelerated reliability model comprises a Hallberg-Peck model.

Clause 18—The method of any of clauses 13-17, wherein estimating the remaining life includes: applying the accelerated reliability model based on events defined by the sensor data; aggregating burdens associated with the events; and defining an amount of wear associated with the circuit based on the aggregated burdens.

Clause 19—The method of any of clauses 13-18, further comprising: disabling the circuit in response to an estimate of the remaining life being less than a threshold.

Clause 20—The method of any of clauses 13-19, further comprising: issuing an alert in response to the estimate of the remaining life being less than a threshold.

Clause 21—The method of any of clauses 13-20, wherein the circuit function unit, the one or more sensors, and the lifetime model unit comprise separate circuits within a circuit package.

Clause 22—A system comprising: a first circuit that includes: a first circuit function unit configured to perform a first circuit function; one or more first sensors associated with the first circuit function unit; and a first lifetime model unit configured to estimate a remaining life of the first circuit, wherein the first lifetime model unit is configured to: receive first sensor data from the one or more first sensors, and estimate the remaining life of the first circuit based on an accelerated reliability model and the first sensor data, wherein the first sensor data comprises first input to the accelerated reliability model; a second circuit that includes: a second circuit function unit configured to perform a second circuit function; one or more second sensors associated with the second circuit function unit; and a second lifetime model unit configured to estimate a remaining life of the second circuit, wherein the second lifetime model unit is configured to: receive second sensor data from the one or more second sensors, and estimate the remaining life of the second circuit based on the accelerated reliability model and the second sensor data, wherein the second sensor data comprises second input to the accelerated reliability model; and a system lifetime model unit configured estimate a remaining life of the system based on the estimate of the remaining life of the first circuit and the estimate of the remaining life of the second circuit.

Clause 23—The system of clause 22, the system further comprising: a third circuit that includes: a third circuit function unit configured to perform a third circuit function; one or more third sensors associated with the third circuit function unit; and a third lifetime model unit configured to estimate a remaining life of the third circuit, wherein the third lifetime model unit is configured to: receive third sensor data from the one or more third sensors, and estimate the remaining life of the third circuit based on the accelerated reliability model and the third sensor data, wherein the third sensor data comprises third input to the accelerated reliability model; and wherein the system lifetime model unit is configured estimate the remaining life of the system based on the estimate of the remaining life of the first circuit, the estimate of the remaining life of the second circuit, and the estimate of the remaining life of the third circuit.

Various examples of the disclosure have been described. Any combination of the described systems, operations, or functions is contemplated. These and other examples are within the scope of the following claims.

What is claimed is:
1. A circuit comprising:
a circuit function unit configured to perform a circuit function;
one or more sensors associated with the circuit function unit; and
a lifetime model unit configured to estimate a remaining life of the circuit, wherein the lifetime model unit is configured to:
receive sensor data from the one or more sensors, and estimate the remaining life of the circuit based on an accelerated reliability model and the sensor data, wherein the sensor data comprises input to the accelerated reliability model.

2. The circuit of claim 1, wherein the one or more sensors include one or more temperature sensors, and wherein the sensor data comprises temperature data.

3. The circuit of claim 2, wherein the accelerated reliability model comprises a Coffin-Manson model.

4. The circuit of claim 2, wherein the accelerated reliability model comprises an Arrhenius model.

5. The circuit of claim 1, wherein the one or more sensors include one or more temperature sensors and one or more humidity sensors, and wherein the sensor data comprises temperature data and humidity data.

6. The circuit of claim 5, wherein the accelerated reliability model comprises a Hallberg-Peck model.

7. The circuit of claim 1, wherein to estimate the remaining life, the lifetime model unit is configured to:
define events associated with the sensor data; and
determine an amount of wear based on the events.

8. The circuit of claim 7, wherein to estimate the remaining life, the lifetime model unit is configured to:
apply the accelerated reliability model based on the events defined by the sensor data;
aggregate burdens associated with the events; and
define the amount of wear associated with the circuit based on the aggregated burdens.

9. The circuit of claim 1, wherein the circuit is configured to disable the circuit in response to an estimate of the remaining life being less than a threshold.

10. The circuit of claim 1, wherein the circuit is configured to issue an alert in response to the estimate of the remaining life being less than a threshold.

11. The circuit of claim 1, wherein the circuit function unit, the one or more sensors, and the lifetime model unit comprise separate circuit modules within a circuit package.

12. The circuit of claim 1, wherein circuit function unit comprises one or more circuit units selected from a group consisting of:
a load driver circuit;
a logic circuit;
a motor driver;
an oscillator circuit;
a level shifter circuit;
a phase shift circuit;
a phase locked loop circuit;
an analog-to-digital converter circuit;
a digital-to-analog converter circuit;
an arithmetic logic unit (ALU);
a processor;
a microcontroller;
a digital signal processor (DSP);
a communication interface circuit;
a digital logic circuit;
a state machine;
a signal processing circuit;
a control circuit;
an analog function circuit;
a sensor; or
a memory circuit.

13. A method comprising:
performing a circuit function via a circuit function unit of a circuit;
receiving sensor data from one or more sensors associated with the circuit function unit; and
estimating a remaining life of the circuit based on an accelerated reliability model and the sensor data, wherein the sensor data comprises input to the accelerated reliability model.

14. The method of claim 13, wherein the one or more sensors include one or more temperature sensors, and wherein the sensor data comprises temperature data.

15. The method of claim 14, wherein the accelerated reliability model comprises a Coffin-Manson model or an Arrhenius model.

16. The method of claim 13, wherein the one or more sensors include one or more temperature sensors and one or more humidity sensors, and wherein the sensor data comprises temperature data and humidity data.

17. The method of claim 16, wherein the accelerated reliability model comprises a Hallberg-Peck model.

18. The method of claim 13, wherein estimating the remaining life includes:
applying the accelerated reliability model based on events defined by the sensor data;
aggregating burdens associated with the events; and
defining an amount of wear associated with the circuit based on the aggregated burdens.

19. The method of claim 13, further comprising:
disabling the circuit in response to an estimate of the remaining life being less than a threshold.

20. The method of claim 13, further comprising:
issuing an alert in response to the estimate of the remaining life being less than a threshold.

21. The method of claim 13, wherein the circuit function unit, the one or more sensors, and the lifetime model unit comprise separate circuits within a circuit package.

22. A system comprising:
a first circuit that includes:
a first circuit function unit configured to perform a first circuit function;
one or more first sensors associated with the first circuit function unit; and
a first lifetime model unit configured to estimate a remaining life of the first circuit, wherein the first lifetime model unit is configured to:
receive first sensor data from the one or more first sensors, and
estimate the remaining life of the first circuit based on an accelerated reliability model and the first sensor data, wherein the first sensor data comprises first input to the accelerated reliability model;
a second circuit that includes:
a second circuit function unit configured to perform a second circuit function;
one or more second sensors associated with the second circuit function unit; and
a second lifetime model unit configured to estimate a remaining life of the second circuit, wherein the second lifetime model unit is configured to:
receive second sensor data from the one or more second sensors, and
estimate the remaining life of the second circuit based on the accelerated reliability model and the second sensor data, wherein the second sensor data comprises second input to the accelerated reliability model; and
a system lifetime model unit configured estimate a remaining life of the system based on the estimate of the remaining life of the first circuit and the estimate of the remaining life of the second circuit.

23. The system of claim 22, the system further comprising:
a third circuit that includes:
a third circuit function unit configured to perform a third circuit function;
one or more third sensors associated with the third circuit function unit; and
a third lifetime model unit configured to estimate a remaining life of the third circuit, wherein the third lifetime model unit is configured to:
receive third sensor data from the one or more third sensors, and
estimate the remaining life of the third circuit based on the accelerated reliability model and the third sensor data, wherein the third sensor data comprises third input to the accelerated reliability model; and
wherein the system lifetime model unit is configured estimate the remaining life of the system based on the estimate of the remaining life of the first circuit, the estimate of the remaining life of the second circuit, and the estimate of the remaining life of the third circuit.

\* \* \* \* \*